US010372043B2

(12) United States Patent
Chen et al.

(10) Patent No.: US 10,372,043 B2
(45) Date of Patent: Aug. 6, 2019

(54) HOTSPOT AWARE DOSE CORRECTION

(71) Applicant: ASML Netherlands B.V., Veldhoven (NL)

(72) Inventors: Gang Chen, Fremont, CA (US); Te-Sheng Wang, San Jose, CA (US)

(73) Assignee: ASML Netherlands B.V., Veldhoven (NL)

(*) Notice: Subject to any disclaimer, the term of this patent is extended or adjusted under 35 U.S.C. 154(b) by 63 days.

(21) Appl. No.: 15/534,391

(22) PCT Filed: Dec. 11, 2015

(86) PCT No.: PCT/EP2015/079467
§ 371 (c)(1),
(2) Date: Jun. 8, 2017

(87) PCT Pub. No.: WO2016/096668
PCT Pub. Date: Jun. 23, 2016

(65) Prior Publication Data
US 2018/0259858 A1    Sep. 13, 2018

Related U.S. Application Data

(60) Provisional application No. 62/265,867, filed on Dec. 10, 2015, provisional application No. 62/093,281, filed on Dec. 17, 2014.

(51) Int. Cl.
*G03F 7/20* (2006.01)

(52) U.S. Cl.
CPC .......... *G03F 7/70558* (2013.01); *G03F 7/705* (2013.01); *G03F 7/70508* (2013.01); *G03F 7/70633* (2013.01)

(58) Field of Classification Search
CPC .. G03F 7/70558; G03F 7/705; G03F 7/70508; G03F 7/70633
USPC .......................................................... 430/30
See application file for complete search history.

(56) References Cited

U.S. PATENT DOCUMENTS

| 5,229,872 | A | 7/1993 | Mumola |
|---|---|---|---|
| 5,296,891 | A | 3/1994 | Vogt et al. |
| 5,523,193 | A | 6/1996 | Nelson |
| 5,969,441 | A | 10/1999 | Loopstra et al. |
| 6,046,792 | A | 4/2000 | Van Der Werf et al. |
| 7,003,758 | B2 | 2/2006 | Ye et al. |
| 7,587,704 | B2 | 9/2009 | Ye et al. |
| 8,200,468 | B2 | 6/2012 | Ye et al. |
| 8,438,508 | B2 | 5/2013 | Liu |
| 8,786,824 | B2 | 7/2014 | Hansen |
| 2006/0273266 | A1 | 12/2006 | Preil et al. |
| 2010/0315614 | A1 | 12/2010 | Hansen |

FOREIGN PATENT DOCUMENTS

WO    2010/059954    5/2010

OTHER PUBLICATIONS

International Search Report and Written Opinion dated Apr. 26, 2016 in corresponding International Patent Application No. PCT/EP2015/079467.

Yishai, Michael Ben et al., "An IntenCD map of a reticle as a feed-forward input to DoseMapper", Proc. of SPIE, vol. 7028, pp. 70283H-1-70283H-11 (2008).

Kahng, Andrew B., "Lithography and design in partnership: a new roadmap", Proc. of SPIE, vol. 7122, pp. 712202-1-712202-10 (2008).

Spence, Chris, "Full-Chip Lithography Simulation and Design Analysis—How OPC Is Changing IC Design," Proc. SPIE, vol. 5751, pp. 1-14 (2005).

Cao, Yu et al., "Optimized Hardware and Software for Fast, Full Chip Simulation," Proc. of SPIE, vol. 5754, pp. 407-414 (2005).

Rosenbluth, Alan E. et al., "Optimum mask and source patterns to print a given shape," J. Microlith., Microfab., Microsys., vol. 1, No. 1, pp. 13-30 (2002).

Granik, Yuri, "Source optimization for image fidelity and throughput," J. Microlith., Microfab., Microsys., vol. 3, No. 4, pp. 509-522 (2004).

Socha, Robert et al., "Simultaneous Source Mask Optimization (SMO)," Proc. of SPIE, vol. 5853, pp. 180-193 (2005).

*Primary Examiner* — Christopher G Young
(74) *Attorney, Agent, or Firm* — Pillsbury Winthrop Shaw Pittman, LLP

(57) ABSTRACT

A method for improving a lithographic process for imaging a portion of a design layout onto a substrate using a lithographic apparatus, the method including: obtaining a relationship of a characteristic of one or more features in the portion with respect to dose; obtaining a value of the characteristic; and obtaining a target dose based on the value of the characteristic and the relationship.

20 Claims, 17 Drawing Sheets

HOTSPOT AWARE DOSE CORRECTION

CROSS-REFERENCE TO RELATED APPLICATIONS

This application is the U.S. national phase entry of PCT patent application no. PCT/EP2015/079467, which was filed on Dec. 11, 2015, which claims the benefit of priority of U.S. provisional patent application No. 62/093,281, which was filed on Dec. 17, 2014, and U.S. provisional patent application No. 62/265,867, which was filed on Dec. 10, 2015, and which applications are incorporated herein in their entireties by reference.

TECHNICAL FIELD

The present disclosure relates to a method of determining dose of exposure for the performance of semiconductor manufacturing process. The method may be used in connection with a lithographic apparatus.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

SUMMARY

Disclosed herein is a method for improving a lithographic process for imaging a portion of a design layout onto a substrate using a lithographic apparatus, the method comprising: obtaining a relationship of a characteristic of one or more features in the portion with respect to dose; obtaining a value of the characteristic; and obtaining, using a computer, a target dose based on the value of the characteristic and the relationship.

According to an embodiment, the relationship is obtained by simulation.

According to an embodiment, the relationship is obtained by simulating values of the characteristic at different doses.

According to an embodiment, the value of the characteristic is obtained by designation of a user, from a metrology tool, or from a specification of the design layout.

According to an embodiment, the characteristic is selected from group consisting of critical dimension (CD), mask error, CD uniformity (CDU), process window, defocus, yield, probability of existence of defects, and stochastic effect.

According to an embodiment, the characteristic is determinable by a single feature.

According to an embodiment, the relationship is a sensitivity of the characteristic with respect to the dose.

According to an embodiment, the characteristic is CD and wherein obtaining the relationship comprises obtaining a sensitivity of the CD with respect to the dose.

According to an embodiment, the characteristic is mask error and wherein obtaining the relationship comprises obtaining a sensitivity of CD with respect to the dose and a value of the mask error enhancement factor (MEEF).

According to an embodiment, the value of the characteristic is a function of positions of the one or more features in the portion of the design layout.

According to an embodiment, the relationship is a function of positions of the one or more features in the portion of the design layout.

According to an embodiment, the target dose is a function of positions of the one or more features in the portion of the design layout.

According to an embodiment, values of the characteristic at a plurality of positions are represented as a map.

According to an embodiment, relationships of the characteristic with respect to the dose at a plurality of positions are represented as a map.

According to an embodiment, target doses at a plurality of positions are represented as a map.

According to an embodiment, the target dose is a target dose of an individual feature of the one or more features.

According to an embodiment, the target dose is a target dose of a region of the design layout, the region having multiple features therein.

According to an embodiment, the target dose of the region is obtained from target doses and attributes of all or some individual features in the region.

According to an embodiment, the target dose is obtained by calculating a weighted average of target doses of all or some individual features in the region.

According to an embodiment, the target dose is obtained by calculating a weighted average of relationships of all or some individual features in the region with respect to dose.

Disclosed herein is a method comprising: selecting one or more features from a region of a patterning device into a group of selected features, based on a sensitivity of the one or more features to an optical parameter; and determining a target dose for the region of the patterning device from a characteristic of the group of selected features in the region.

According to an embodiment, the group of selected features comprises at least one anchor feature.

According to an embodiment, the group of selected features comprises one or more hot spots in the region.

According to an embodiment, the group of selected features comprises not all hot spots in the region.

According to an embodiment, the method further comprises: identifying all hot spots in the region; and including into the group of selected features a plurality of hot spots with highest dose sensitivities among all the hot spots in the region.

According to an embodiment, the method further comprises: identifying all hot spots in the region; grouping the hot spots into a plurality of types; and within each of the types, including a plurality of hot spots with highest dose sensitivities within those hot spots of that type into the group of selected features.

According to an embodiment, a number of hot spots included from each type into the group of selected features is not the same.

According to an embodiment, the method further comprises: identifying all hot spots in the region; grouping the hot spots into a plurality of types; within each of the types, identifying a hot spot with a highest dose sensitivity within all the hot spots of that type; selecting a subset of types whose respective hot spots with the highest dose sensitivity are the highest among the plurality of types; and within each subset of the types, including a plurality of hot spots with highest dose sensitivities within those hot spots of that type into the group of selected features.

According to an embodiment, selecting the subset of types comprises ranking the plurality of types by their respective hot spots of the highest dose sensitivity.

According to an embodiment, the method further comprises: determining whether any of the hot spots in the region is defective under the target dose for the region; if at least one of the hot spots in the region is defective, adjusting how the target dose for the region is determined from the characteristic of the group of selected features and redetermining the target dose for the region.

According to an embodiment, the target dose is a weighted average of target doses for the characteristic of the group of selected features.

According to an embodiment, determining a target dose comprises optimizing a function of the characteristic of the group of selected features by adjusting a set of parameters of the function.

According to an embodiment, adjusting the set of parameters is by minimizing or maximizing a cost function that is a function of the set of parameters and whose value is affected by the target dose for the region.

According to an embodiment, adjusting how the target dose for the region is determined comprises adding one or more anchor features into the group of selected features, removing one or more anchor features from the group of selected features, designating one or more anchor features in the group of selected features as a non-anchor feature, or designating one or more non-anchor features in the group of selected features as an anchor feature.

Disclosed herein is a computer program product comprising a computer readable medium having instructions recorded thereon, the instructions when executed by a computer implementing any of the methods herein.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION

Figure 1:
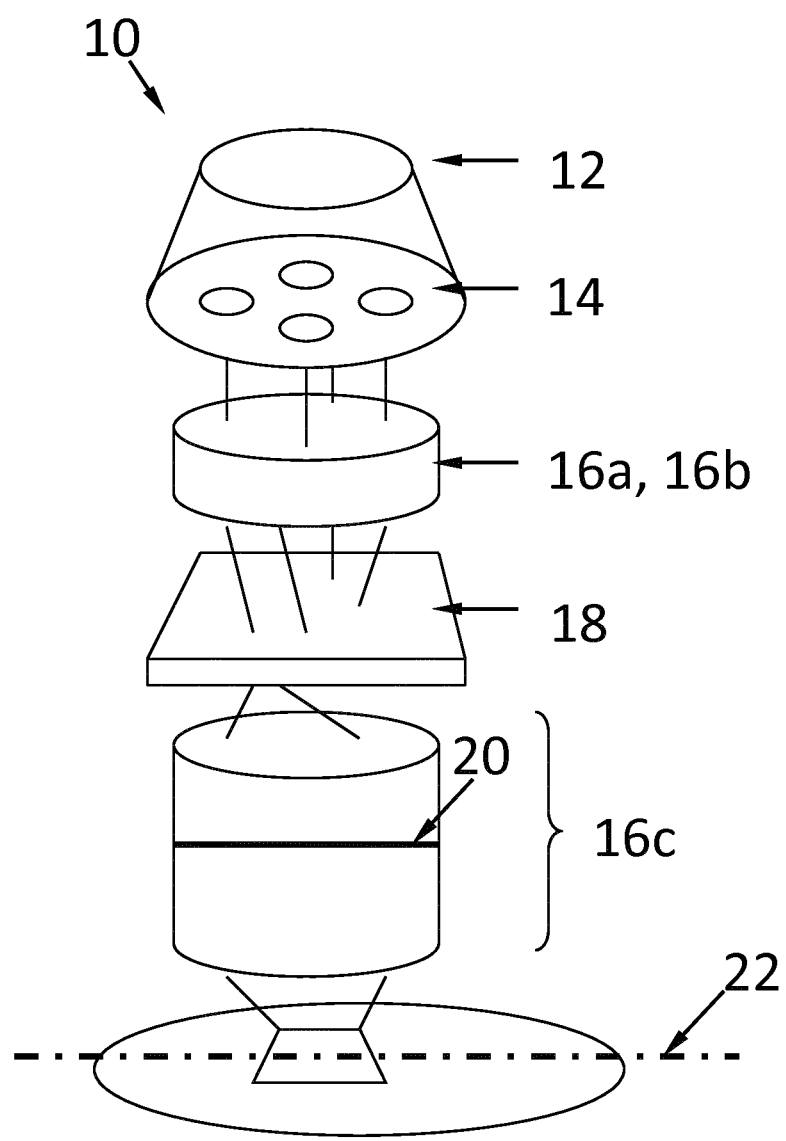
FIG. 1 is a block diagram of various subsystems of a lithography system according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

As an example, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Also, person skilled in the art will recognize that, especially in the context of lithography simulation/optimization, the term "mask," "patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an exact science, but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as γ in Granik' s method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus, for example, parameters a user of the lithographic projection apparatus can adjust. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2×nm node.

A source and patterning device (design layout) optimization method and system that allows for simultaneous optimization of the source and patterning device using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

Another source and patterning device optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

Although specific reference may be made in this text to the use of the embodiments in the manufacture of ICs, it should be explicitly understood that the embodiments has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as interchangeable with the more general terms "mask," "substrate" and "target portion," respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting an apparatus or process, e.g., a lithographic apparatus or an optical lithography process step, such that patterning and/or device fabrication results and/or processes (e.g., of lithography) have one or more desirable characteristics, such as higher accuracy of projection of a design layout on a substrate, larger process window, etc.

Further, the lithographic projection apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprise design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. One of the goals in integrated circuit fabrication is to faithfully reproduce the original circuit design on the substrate (via the patterning device).

The term patterning device as employed in this text may be broadly interpreted as referring to generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The matrix addressing can be performed using suitable electronics. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 1 illustrates an exemplary lithographic projection apparatus 10. Major components are an illumination source 12, which may be a deep-ultraviolet excimer laser source or other type of sources including extreme ultra violet (EUV) sources, illumination optics which define the partial coherence (denoted as sigma) and which may include optics 14, 16a and 16b that shape radiation from the source 12; a patterning device (e.g., a mask or reticle) 18; and transmission optics 16c that project an image of the patterning device pattern onto a substrate plane 22. An adjustable filter or aperture 20 at the pupil plane of the projection optics may restrict the range of beam angles that impinge on the substrate plane 22, where the largest possible angle defines the numerical aperture of the projection optics $NA=\sin(\Theta_{max})$.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations. The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic projection apparatus, a source provides illumination (i.e. radiation); projection optics direct and shapes the illumination via a patterning device and onto a substrate. The term "projection optics" is broadly defined here to include any optical component that may alter the wavefront of the radiation beam. For example, projection optics may include at least some of the components 14, 16a, 16b and 16c. An aerial image (AI) is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
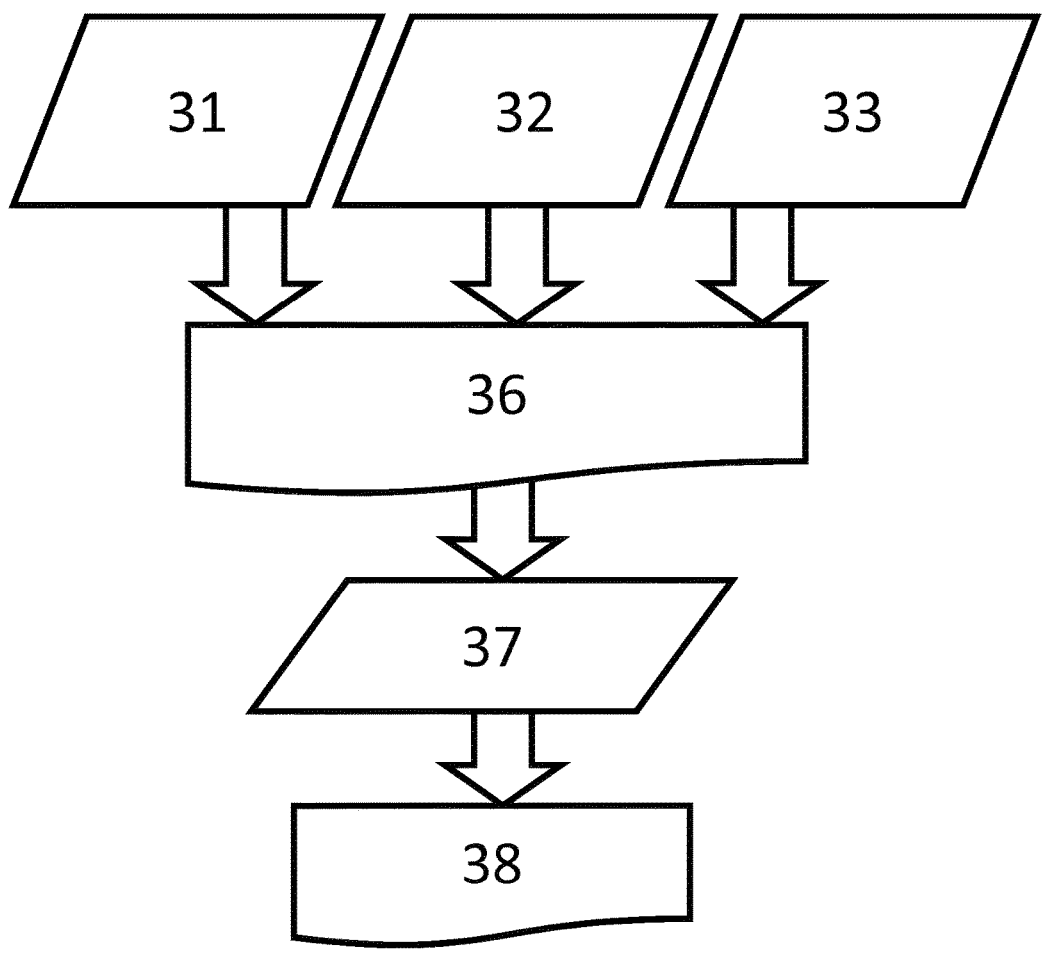
FIG. 2 is a block diagram of simulation models corresponding to the subsystems in FIG. 1.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. The projection optics model 32 may include aberration caused by various factors, for example, heating of the components of the projection optics, stress caused by mechanical connections of the components of the projection optics. The source model 31 and the projection optics model 32 can be combined into a transmission cross coefficient (TCC) model. A design layout model 33 represents optical characteristics (including changes to the radiation intensity distribution and/or the phase distribution caused by a given design layout) of a design layout, which is the representation of an arrangement of features of a patterning device. An aerial image 36 can be simulated from the source model 31, the projection optics model 32 and the design layout model 33. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma (σ) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, absorption, etc. The design layout model 33 can also represent physical properties of a physical patterning device, as described, for example, in U.S. Pat. No. 7,587,704, which is incorporated by reference in its entirety. The objective of the simulation is to accurately predict, for example, edge placements and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips." In a specific embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

Examples of optimization methods can be found, for example, in U.S. patent application Ser. No. 12/914,946 filed Oct. 28, 2010, the disclosure of which is hereby incorporated by reference in its entirety.

Figure 3:
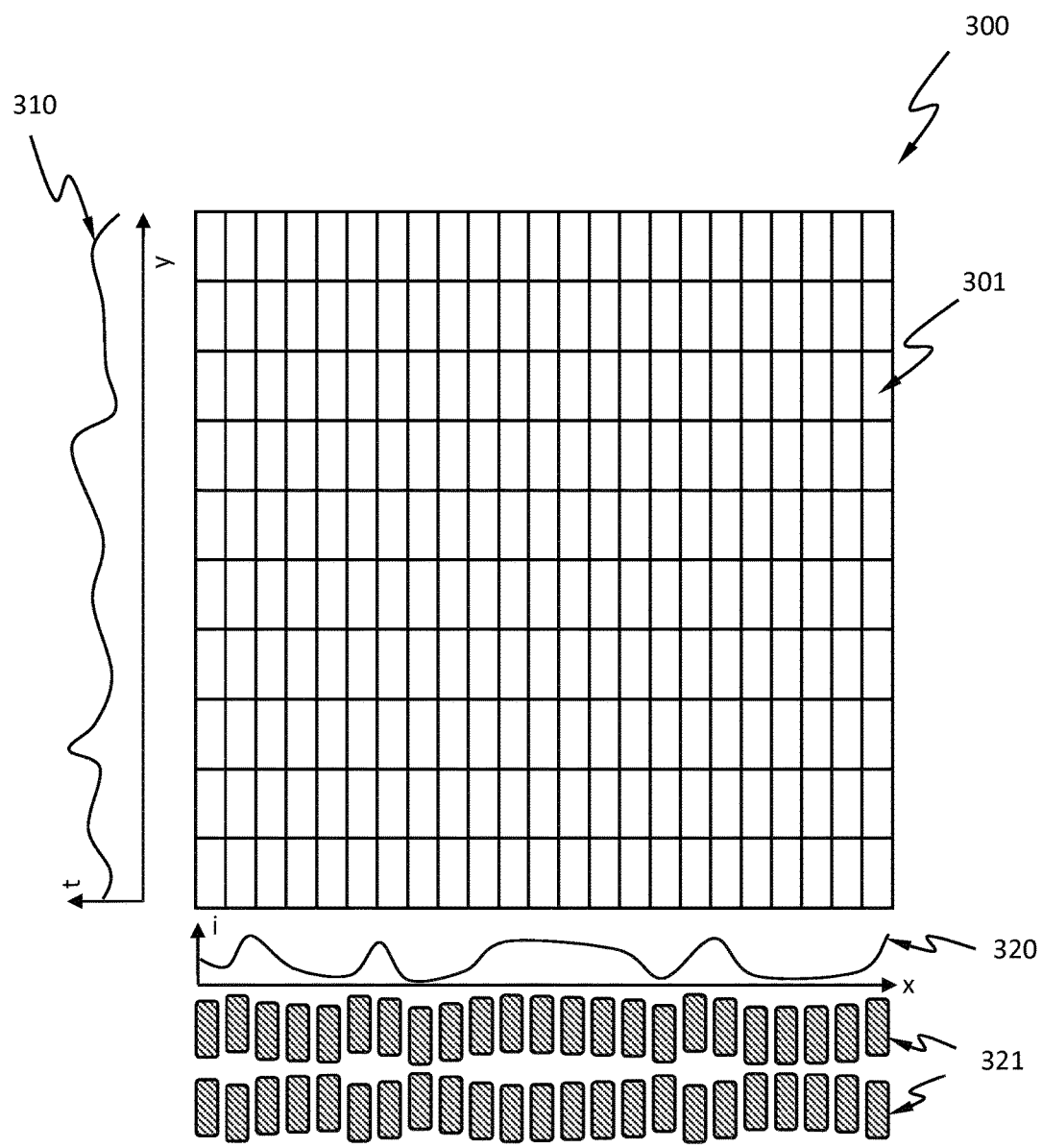
FIG. 3 schematically illustrates one particular type of RET that involves position-dependent adjustments of dose in an area of a patterning device.

FIG. 3 schematically illustrates one particular type of RET that involves position-dependent adjustments of dose in an area 300 of a patterning device. A beam from the source can scan at various speeds across the scanning direction y over the patterning device, and thus dwells for different amounts of time t at each position along the scanning direction y, thereby adjusting the overall dose each line receives along a direction x that is perpendicular to the scanning direction y. Within all positions along a line perpendicular to the scanning direction y are exposed simultaneously. Curve 310 is an exemplary curve of dwell time as a function of y. The radiation intensity i along each line along direction x can also be adjusted. Curve 320 is an exemplary curve of radiation intensity i as a function of x. For example, pairs of radiation-blocking fingers 321 can be disposed along the slit. By adjusting the gap between each pair of fingers, the radiation intensity i along each line along direction x can be changed. For example, the pairs of fingers have wider gaps at positions along x to allow more radiation to pass the gaps, thereby increasing i at those positions; the pairs of fingers have narrower gaps at positions along x to allow less radiation to pass the gaps, thereby decreasing i at those positions. This adjustment may or may not be fine-grained enough to allow adjustment of the dose for each individual feature on the patterning device due to the precision of scanning control and the size of the fingers. Therefore, the area 300 may be divided into an array of regions 301, where the dose is adjustable but uniform in each region. The minimum size of the regions may be limited by hardware of the lithographic apparatus. The regions may not necessarily be square in shape or uniform in size. For example, the regions may have a linear size from 100 to 1000 microns. Each region may include many features.

Regardless of the size of the regions, the position-dependent adjustments of dose are of little use if it is difficult to determine a target dose of each region or a target dose of an individual feature. The term "target dose" means a dose that causes a certain advantage or desired property. The target dose may be affected by many factors such as certain characteristics of the features in the design layout. In an example, the characteristics include CDs in the region. In another example, the characteristics may include a combination of many factors, such as CD, mask error (an error in the shape and size of a feature on the patterning device), CD uniformity (CDU), process window, defocus, yield, probability of the existence of defects, stochastic effect, etc. The characteristics may be localized (i.e., determinable by a single feature) such as CD and defocus or non-localized (i.e., not determinable by a single feature) such as CDU, overlapping process window and yield.

To determine the target dose, knowledge of the relationship between the characteristics and the target dose and knowledge of the values of the characteristics would be very useful. In an example, the relationship may be sensitivities of the characteristics with respect to the dose. In mathematical terms, the sensitivities are the partial derivatives of the characteristics with respect to the dose.

Figure 4:
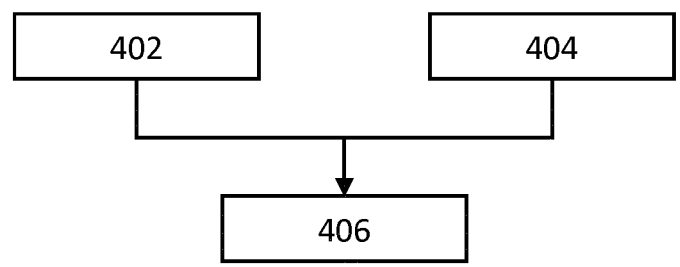
FIG. 4 shows a flow chart for a method for determining a target dose.

FIG. 4 shows a flow chart for a method for determining a target dose. In step 402, a relationship of a characteristic of one or more features in a portion of a design layout with respect to the dose is obtained. One way to obtain the relationship is by simulation. For example, values of the characteristic at different doses can be simulated using a suitable method such as that in FIG. 2 and the relationship is determined from those values. In step 404, a value of the characteristic is obtained. The value may be obtained by any suitable methods, such as by designation of a user, from a metrology tool, or from a specification of the design layout (e.g., the value of CD in the specification). Steps 402 and 404 may be carried out at the same time, one after another or vice versa. The value and the relationship may be obtained from a database or from an empirical model. In step 406, the target dose is obtained based on the relationship and the value of the characteristic. The value of the characteristic may be a function of positions of the one or more features in the portion of the design layout. The values of the characteristic at a plurality of positions may represented as a map of the values of the characteristic. The relationship may be a function of positions of the one or more features in the portion of the design layout. The relationships at a plurality of positions may represented as a map of the relations. Similarly, the target dose may be a function of positions of the one or more features in the portion of the design layout. The target doses at a plurality of positions may represented as a map of the doses.

Figure 5:
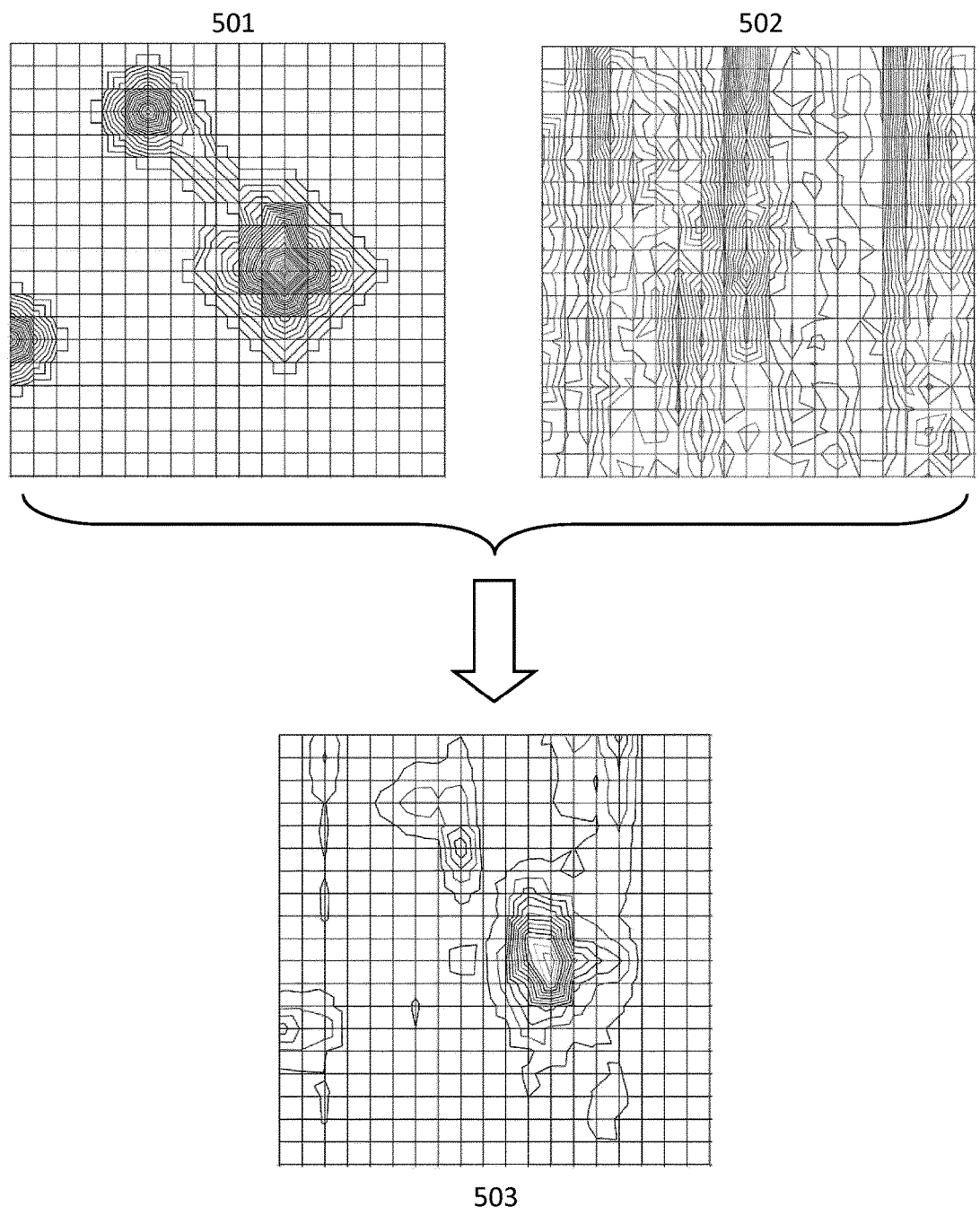
FIG. 5 schematically shows one example of obtaining the target doses from the values of CD.

FIG. 5 schematically shows one example of obtaining the target doses from the values of CD. The values of CD in this example are from a specification of a design layout, namely the intended values of CD. The values of CD as a function of position are represented in an exemplary isopleth map 501. Sensitivities of the CD with respect to dose as a function of position are represented in an exemplary isopleth map 502. Target doses as a function of position may be obtained by dividing the values of CD with sensitivities at the same position, and represented in an isopleth map 503.

Figure 6:
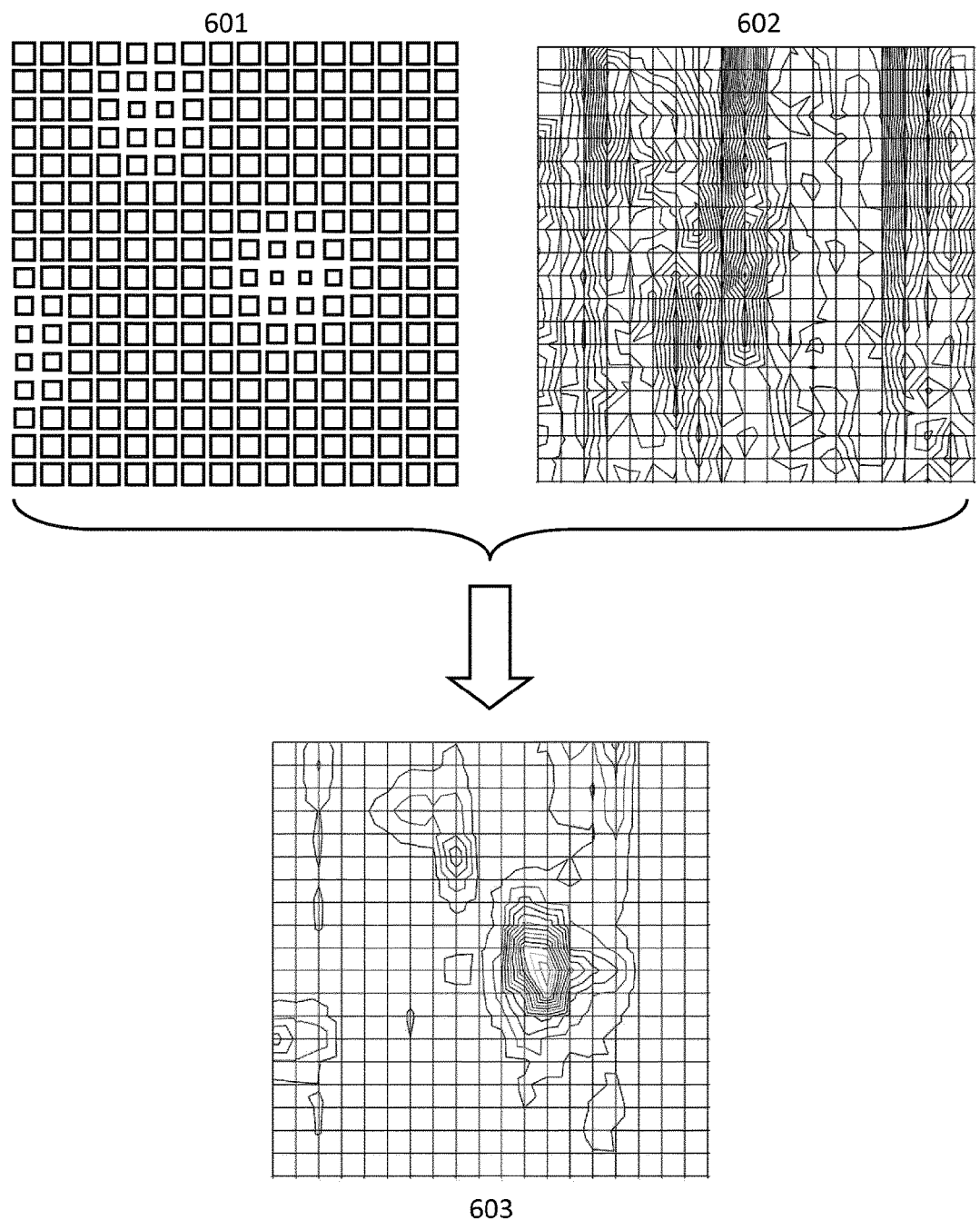
FIG. 6 schematically shows another example of obtaining the target doses from the values of mask error.

FIG. 6 schematically shows another example of obtaining the target doses from the values of mask error. The values of mask error as a function of position may be obtained from a mask inspection tool. The values of mask error as a function of position are represented in an exemplary map 601. Sensitivities of the mask error with respect to dose as a function of position are represented in an exemplary isopleth map 602. The sensitivities of the mask error with respect to dose as a function of position may be obtained by dividing the sensitivities of CD with respect to dose as a function of position with the mask error enhancement factors (MEEF) as a function of position. Target doses as a function of position may be obtained by dividing the values of mask error with sensitivities of the mask error with respect to dose at the same position, and represented in an isopleth map 603.

Figure 7:
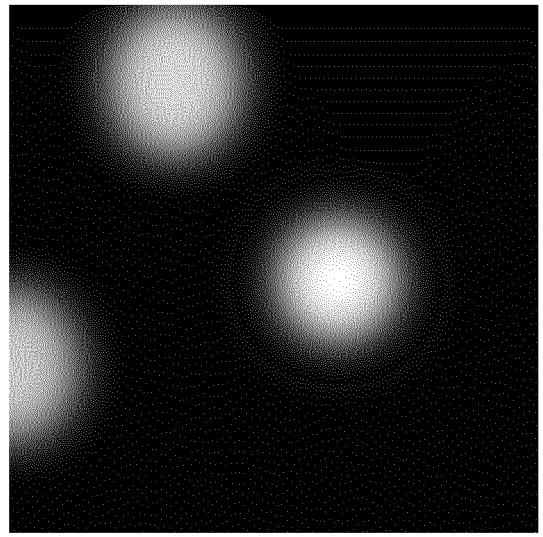
FIG. 7 schematically shows an example of how to obtain the target doses for the regions in the area of the patterning device when the regions are larger than the features on the patterning device.
Figure 7:
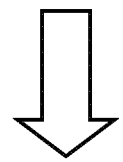
Figure 7:
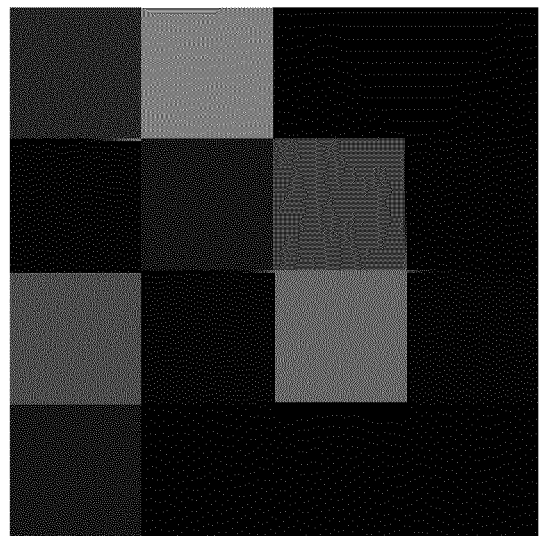

FIG. 7 schematically shows an example of how to obtain the target doses for the regions in the area of the patterning device when the regions are larger than the features on the patterning device. Namely, when the adjustment of dose is not fine-grained enough to enable adjustment of the dose for each individual feature due to limitations of the lithographic apparatus. The target dose for a region may be obtained from the target doses and attributes (e.g., CD, width, pitch, sensitivities with respect to dose, etc.) of the features within the region. In an example, the target dose for a region may be obtained by calculating a weighted average of target dose of all or some individual features in the region. Certain features may carry lower weights than others, or be omitted from, the weighted average, based on simulation or an empirical model. In another example, the target dose for a region may be obtained by calculating a weighted average of relations of all or some individual features in the region with respect to dose.

Figure 8:
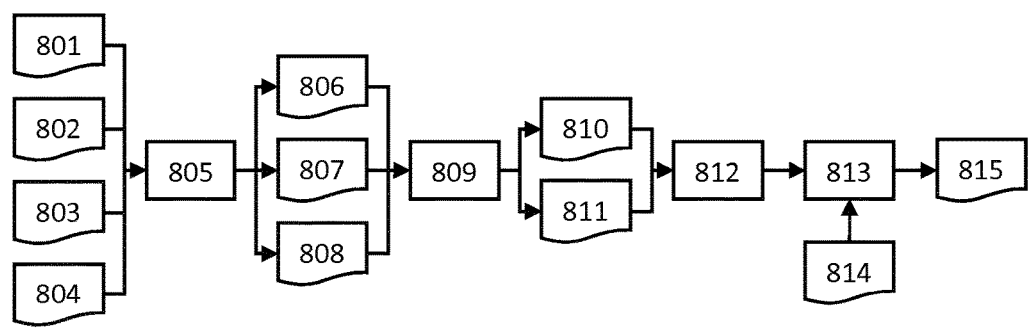
FIG. 8 shows a flow incorporating some of the embodiments herein.

FIG. 8 shows a flow incorporating some of the methods disclosed above. Design layout 801, lithography model 802, parameters of the lithographic process 803 (e.g., nominal mask bias, nominal dose), configurations of the lithographic apparatus 804 may be used to in step 805 select features in a region for calculating the target dose for the region. Nominal dose 806, perturbation of dose 807, perturbation of mask CD 808 may be used to calculate in step 809 sensitivities such as CD sensitivities 810 with respect to dose and mask bias sensitivities (as manifested in MEEF) 811, which are then used in step 812 to generate maps such as a map of target dose (i.e., target dose as a function of position) and a map of MEEF. The maps and metrology data 814 (e.g., CD error, mask error) are then fed into a dose correction engine 813 to generate a recipe or program to be executed by the lithographic apparatus to implement the target dose.

The target dose for a region among an array of regions into which an area of a patterning device is divided is not necessarily determined from a characteristic of all the features in that region, as explained in relation to FIG. 7. In an embodiment, the target dose for a region is determined from a characteristic of a group of selected features in the region. The selected features may include one or more "anchor features." An anchor feature is a feature used downstream to monitor the lithographic process. A region does not necessarily include an anchor feature. The selected features may include one or more "hot spots" in the region, but not necessarily all the hot spots in the region. The concept of "hot spots" is closely associated with the concept of process window. A process window for a feature is a space of processing parameters under which the feature will be produced within specification. Various features in a region may have different process windows. The process windows of all the features in a region may be obtained by merging (e.g., overlapping) the process window of each individual feature in that region. The boundary of the process window of all the features contains boundaries of the process windows of some of the individual features. In other words, these individual features limit the process window of all the features in the region. These features can be referred to as "hot spots." When controlling a lithographic process with respect to a region, it is possible and economical to focus on the hot spots in the region. When the hot spots in the region are not defective, it is most likely that the all the features in the region are not defective.

Figure 9:
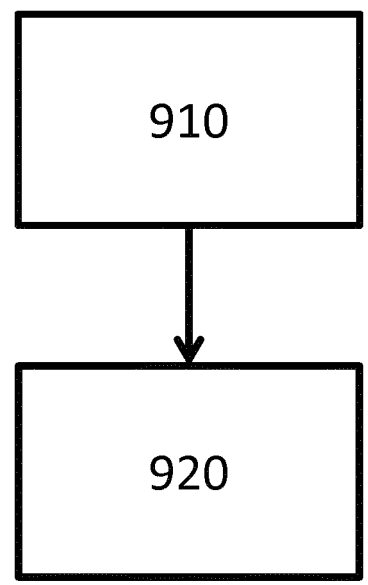
FIG. 9 schematically shows a flow for obtaining a group of selected features, from a characteristic of which group the target dose is determined.

FIG. 9 schematically shows a flow for obtaining a group of selected features. In an embodiment, a target dose is determined from a characteristic of the group. In 910, all hot spots in the region are identified. In 920, among all the hot spots in the region, a number of hot spots with the highest sensitivity to an optical parameter (i.e., the sensitivity of a characteristic of the hot spot with respect to the optical parameter, e.g., sensitivity with respect to dose, hereinafter dose sensitivity; the discussion hereafter for convenience focuses on dose and dose sensitivity, but can be extended to other optical parameters) are selected and included into the group of selected features. The number of hot spots selected may be designated by an operator of the lithographic process.

Figure 10:
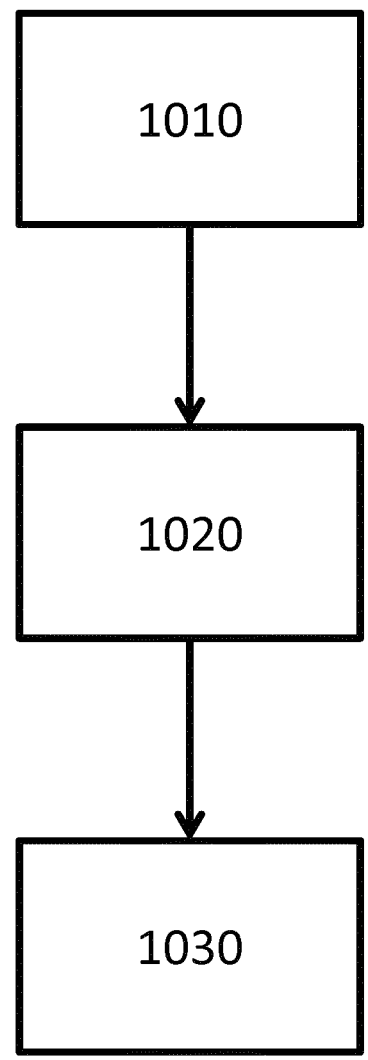
FIG. 10 schematically shows a flow for obtaining a group of features, from a characteristic of which group the target dose is determined.

FIG. 10 schematically shows a flow for obtaining a group of features. In an embodiment, a target dose is determined from a characteristic of the group. In 1010, all hot spots in the region are identified. In 1020, the hot spots are grouped into a number of "types." Hot spots of different type are dissimilar under a criterion; hot spots of the same type are similar under the criterion. For example, the criterion is that two features must have the same shape but can have different orientations. For example, the criterion is that two features must have the same shape and same surroundings. In 1030, within each of the types, a number of hot spots with the highest dose sensitivity within those hot spots of that type are selected and included into the group of selected features. The number of hot spots included from each type into the group of selected features does not have to be the same.

Figure 11:
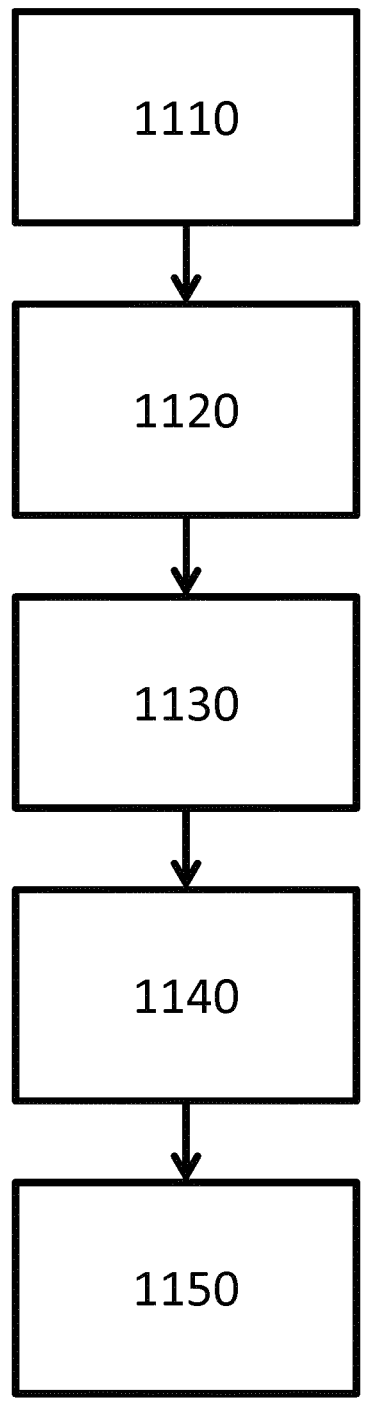
FIG. 11 schematically shows a flow for obtaining a group of features, from a characteristic of which group the target dose is determined.

FIG. 11 schematically shows a flow for obtaining a group of features. In an embodiment, a target dose is determined from a characteristic of the group. In 1110, all hot spots in the region are identified. In 1120, the hot spots are grouped into a number of "types." In 1130, within each of the types, a hot spot with the highest dose sensitivity within all the hot spots of that type is identified. In 1140, a subset of types whose respective hot spots with the highest dose sensitivity are the highest among all the types is selected. For example, the types can be ranked in a descending order by their respective hot spots of highest dose sensitivity, and the first several types so ranked are selected (e.g., by number, e.g., a top number selected from 0-50, 0-100, 0-200, 0-300, 0-500, or 0-1000 or percentage, e.g., a top percentage selected from 0-5%, 0-10%, 0-15%, or 0-20%). In 1150, within each of the selected types, a number of hot spots with the highest dose sensitivity within those hot spots of that selected type are selected and included into the group of selected features.

Figure 12:
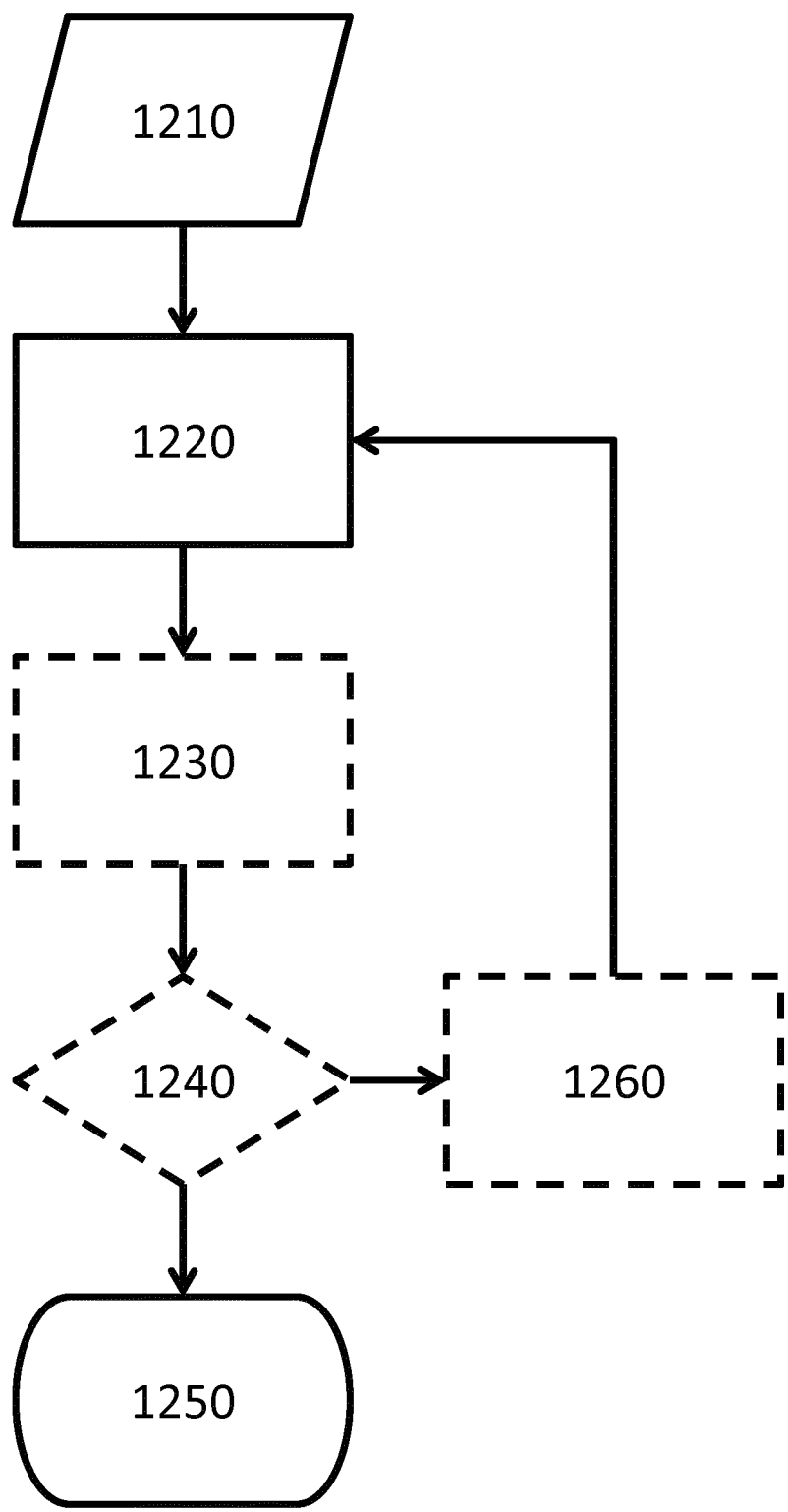
FIG. 12 schematically shows a flow for determining a target dose for a region.

FIG. 12 schematically shows a flow for determining a target dose for a region. In 1220, a target dose is determined from a characteristic of the selected features 1210 in the region. The target dose for the region can be a weighted average of target doses for the characteristic of the selected features 1210. The target dose for the characteristic of a selected feature is the dose under which the characteristic of that selected feature has a target value. The target value of the characteristic can be determined from the design layout. For example, when the characteristic is a CD, the target value of the characteristic is an intended dimension. The weights for the selected features 1210 in the weighted average can be the same. The weights for the selected features 1210 in the weighted average can different. For example, if the selected features 1210 include an anchor feature, the weight for the anchor feature can be higher than the weights for all the other selected features. For example, those with higher dose sensitivity among the selected features 1210 can be given higher weights. In optional 1230, it is determined whether any of the hot spots in the region is defective under the target dose for the region (e.g., by performing actual exposures and measuring CD of hotspots). In optional 1240, if none of the hot spots in the region is defective, the flow ends at 1250; if at least one of the hot spots in the region is defective, the flow goes to optional 1260 where the manner in which the target dose for the region is determined from the characteristic of the selected features 1210 is adjusted (e.g., the weights are adjusted); and the flow goes back to 1220. In optional 1260, one or more anchor features may be added into the selected features, one or more anchor features may be removed from the selected features, one or more anchor features in the selected features may be designated as a non-anchor feature, or one or more non-anchor features in the selected features may be designated as an anchor feature.

Figure 13:
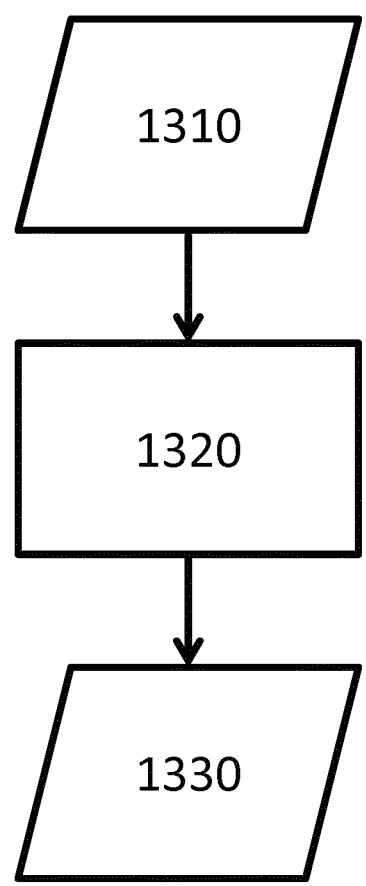
FIG. 13 schematically shows a flow for determining a target dose for a region.

FIG. 13 schematically shows a flow for determining the target dose for a region, where the target dose 1330 for the region is determined from a characteristic of the selected features 1310 in the region using an optimization method 1320. The target dose 1330 can be represented by T and the characteristic of selected feature i among the selected features 1310 can be represented by $C_i$. Mathematically, T=$f$ ({C}; {P}), where $f$ is a function of {C}={$C_i$; i=1, 2, . . . } with a set of parameters {P}. For example, the set of parameters {P} may include the weights described in relation to FIG. 12. The function $f$ can be optimized by an optimization method 1320 where the values of the set of parameters {P} are iteratively adjusted. The values of the set of parameters {P} can be adjusted by minimizing or maximizing a cost function CF that is a function of the set of parameters {P} and whose value is affected by the target dose for the region. For example, the cost function F can be affected by the deviations of the target values of the characteristic for the selected features 1310 under the target dose T for the region. For example, CF=$\Sigma_i[\gamma_i(T_i-T)]^2$, where $\gamma_i$ is the dose sensitivity for the selected feature i, $T_i$ is the target dose for the selected feature i, and $\gamma_i(T_i-T)$ is the deviation of the target value of the characteristic for the selected feature i. In this example, CF is a function of the set of parameters {P} because T is a function of the set of parameters {P}. The target dose for the region may be subject to constraints such as those due to the limitation of the hardware of the lithographic apparatus.

Various quantities related to the target dose may be represented as maps. Examples of these quantities may include the mean of the deviations of the target doses of the selected features in a region from the target dose for the region $$\overline{\Delta T} = \frac{\sum_{i=1}^{n}(T_i - T)}{n},$$

where $\Delta T=(T_i-T)$, the standard deviation of the deviations of the target doses of the selected features in a region from the target dose for the region $$\sigma_{\Delta T} = \sqrt{\frac{\sum_{i=1}^{n}[(T_i - T) - \overline{\Delta T}]^2}{n}},$$

and the mean and standard deviation of normalized characteristic. These maps may be presented to an operator of the lithographic process.

So, in an embodiment, the patterning device field is divided into pixels (e.g., within the range of 0.1-1 mm²) and dose sensitive features are found via simulation across the field. If information about the patterning device is known (e.g., CD of such dose sensitive features on the patterning device), the simulation can determine the target dose of each feature by compensating, e.g., the delta CD (i.e., difference between actual and expected CD) on the patterning device. If information about the patterning device is not known, then verification using exposed substrates with the patterning device may be necessary to optimize the final dose correction. In order to support such substrate verification effectively, lithographic apparatus parameters may be generated using the simulation to enable exposure of multiple conditions (FEM or PWQ like layout) to test a wide range of conditions and fast metrology (e.g., electron beam CD metrology) may be used to improve cycle time of feedback.

Returning to determining dose sensitive features, a delta dose ($\Delta E_i$) for each feature to be on target is determined with respected to nominal dose ($E_0$), which may be inline feedback controlled for an anchor, if any. The mean and deviation of delta dose is then calculated for all the dose sensitive features for each pixel. The mean delta dose is then further adjusted with patterning process constraints, such as lithographic apparatus constraints such as slit and scan fittings, etc. to result in a delta dose for exposure usage. The predicted CD for each feature can then be calculated with the dose slope of each feature.

Further, normalized CD to CD-target for each feature can be calculated as $NCD_i$. The mean and deviation of NCD for each pixel is obtained and hence a corresponding map can be generated. A user can apply specifications for both the mean and deviations of NCD for the features to avoid over and under correction. When the mean and deviation of NCD are both within specification, the corresponding dose correction is then qualified for exposure.

In an embodiment, the user can specify any feature to be on target exactly and the additional dose shifted from nominal is applied for the delta dose calculation.

The description herein has for convenience focused on dose, dose sensitivity, etc., but can be extended to other optical parameters as appropriate (e.g., focus, transmissivity, intensity, aberrations, etc.)

Figure 14:
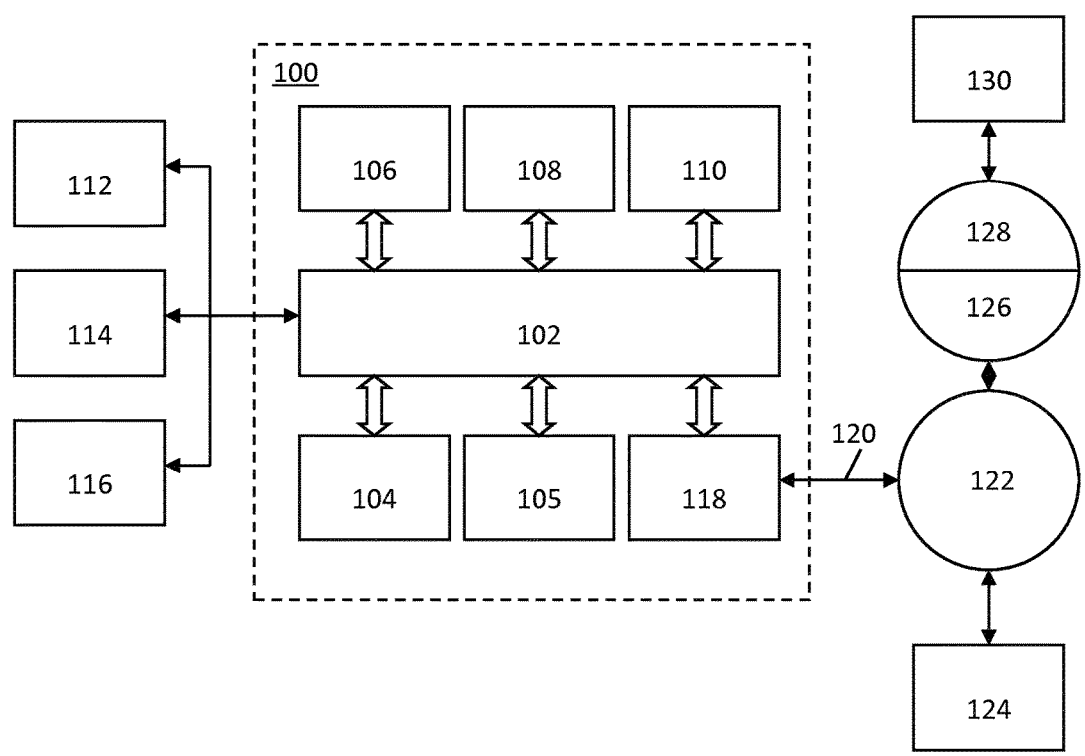
FIG. 14 is a block diagram of an example computer system in which embodiments can be implemented.

FIG. 14 is a block diagram that illustrates a computer system 100 which can assist in implementing the methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 15:
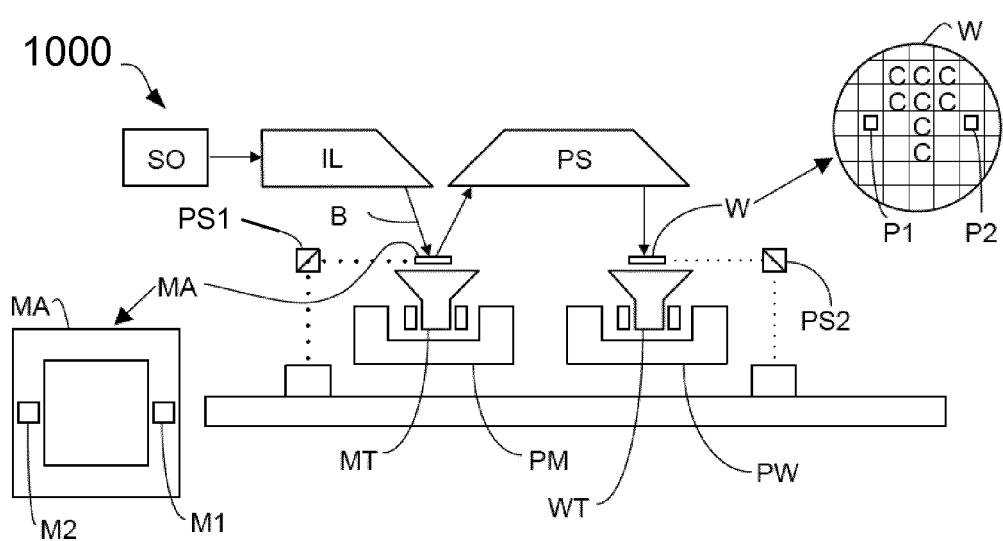
FIG. 15 is a schematic diagram of another lithographic projection apparatus.

FIG. 15 schematically depicts another exemplary lithographic projection apparatus 1000 whose illumination source could be optimized utilizing the methods described herein.

The lithographic projection apparatus 1000 includes:
- a source collector module SO
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 15, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 15, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 16:
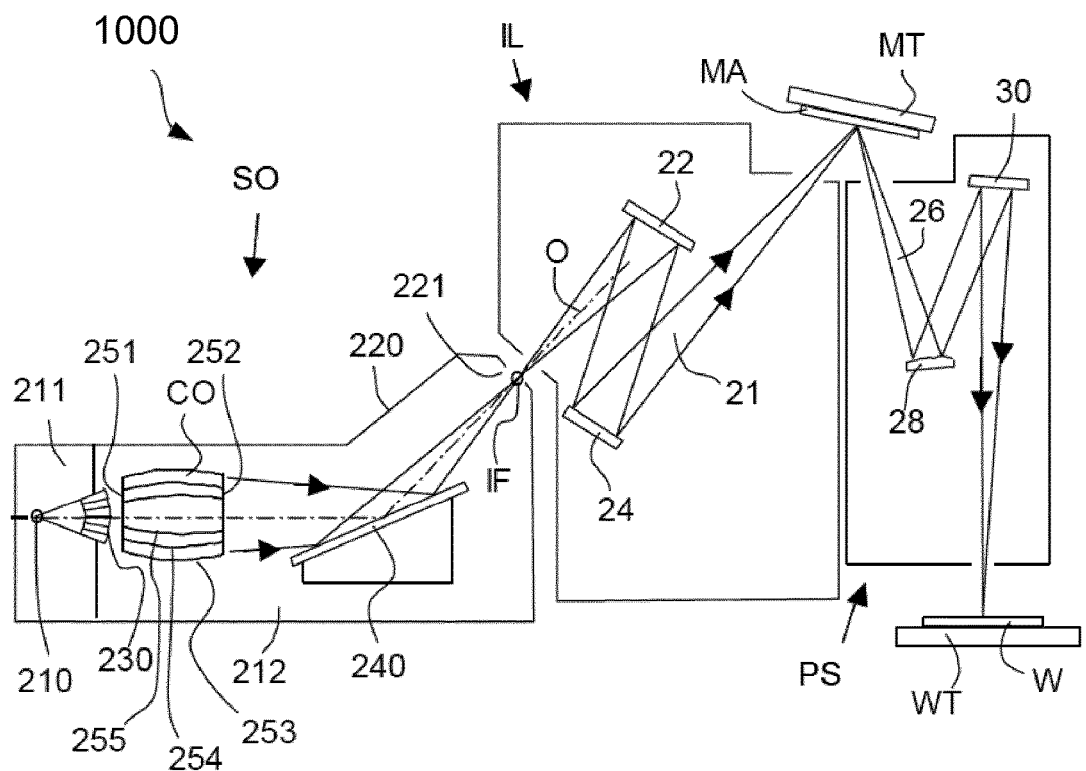
FIG. 16 is a more detailed view of the apparatus in FIG. 15.

FIG. 16 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 16.

Collector optic CO, as illustrated in FIG. 16, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 17:
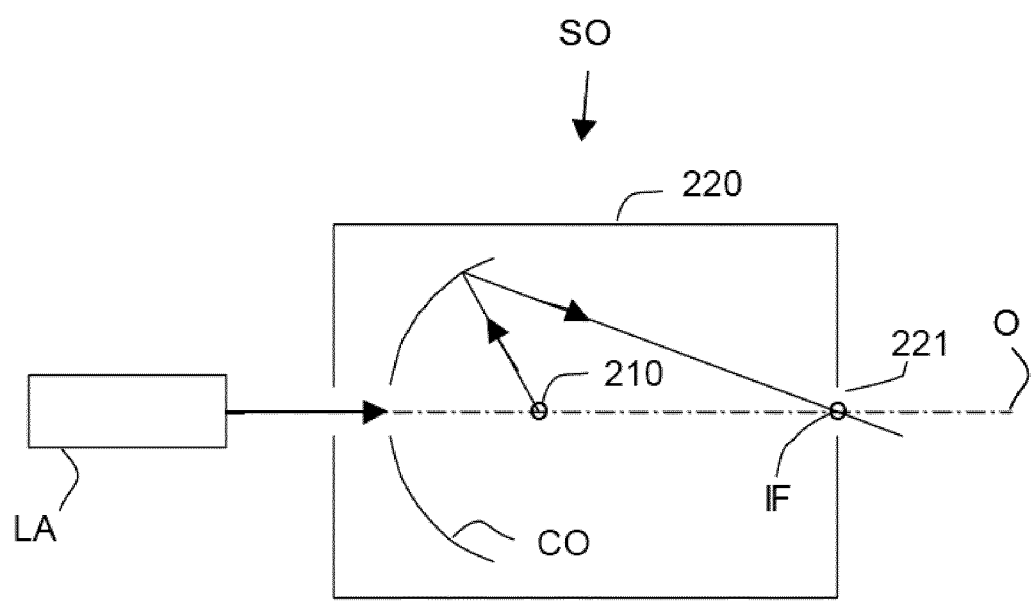
FIG. 17 is a more detailed view of the source collector module SO of the apparatus of FIG. 15 and FIG. 16.

Alternatively, the source collector module SO may be part of an LPP radiation system as shown in FIG. 17. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The invention may further be described using the following clauses:

1. A method for improving a lithographic process for imaging a portion of a design layout onto a substrate using a lithographic apparatus, the method comprising:
   obtaining a relationship of a characteristic of one or more features in the portion with respect to dose;
   obtaining a value of the characteristic; and
   obtaining, by a computer, a target dose based on the value of the characteristic and the relationship.
2. The method of clause 1, wherein the relationship is obtained by simulation.
3. The method of clause 1, wherein the relationship is obtained by simulating values of the characteristic at different doses.
4. The method of any of clauses 1 to 3, wherein the value of the characteristic is obtained by designation of a user, from a metrology tool, or from a specification of the design layout.
5. The method of any of clauses 1 to 4, wherein the characteristic is selected from group consisting of critical dimension (CD), mask error, CD uniformity (CDU), process window, defocus, yield, probability of existence of defects, and stochastic effect.
6. The method of any of clauses 1 to 5, wherein the characteristic is determinable by a single feature.
7. The method of any of clauses 1 to 6, wherein the relationship is a sensitivity of the characteristic with respect to the dose.
8. The method of any of clauses 1 to 7, wherein the characteristic is CD and wherein obtaining the relationship comprises obtaining a sensitivity of the CD with respect to the dose.
9. The method any of clauses 1 to 7, wherein the characteristic is mask error and wherein obtaining the relationship comprises obtaining a sensitivity of CD with respect to the dose and a value of the mask error enhancement factor (MEEF).
10. The method of any of clauses 1 to 9, wherein the value of the characteristic is a function of positions of the one or more features in the portion of the design layout.
11. The method of any of clauses 1 to 10, wherein the relationship is a function of positions of the one or more features in the portion of the design layout.
12. The method of any of clauses 1 to 11, wherein the target dose is a function of positions of the one or more features in the portion of the design layout.
13. The method of any of clauses 1 to 12, wherein values of the characteristic at a plurality of positions are represented as a map.
14. The method of any of clauses 1 to 13, wherein relationships of the characteristic with respect to the dose at a plurality of positions are represented as a map.
15. The method of any of clauses 1 to 14, wherein target doses at a plurality of positions are represented as a map.

16. The method of any of clauses 1 to 15, wherein the target dose is a target dose of an individual feature of the one or more features.
17. The method of any of clauses 1 to 16, wherein the target dose is a target dose of a region of the design layout, the region having multiple features therein.
18. The method of clause 17, wherein the target dose of the region is obtained from target doses and attributes of all or some individual features in the region.
19. The method of clause 18, wherein the target dose is obtained by calculating a weighted average of target doses of all or some individual features in the region.
20. The method of clause 18, wherein the target dose is obtained by calculating a weighted average of relationships of all or some individual features in the region with respect to dose.
21. A method comprising:
selecting a feature from a region of a patterning device into a group of selected features, based on a sensitivity of the feature to an optical parameters; and
determining a target optical parameter for the region from a characteristic of the group of selected features in the region.
22. The method of clause 21, wherein the group of selected features comprises an anchor feature.
23. The method of clause 21 or clause 22, wherein the group of selected features comprises a hot spot in the region.
24. The method of any of clauses 21 to 23, wherein the group of selected features comprises not all hot spots in the region.
25. The method of any of clauses 21 to 24, further comprising:
identifying all hot spots in the region; and
including into the group of selected features a plurality of hot spots with highest optical parameter sensitivity among all the hot spots in the region.
26. The method of any of clauses 21 to 24, further comprising:
identifying all hot spots in the region;
grouping the hot spots into a plurality of types; and
within each of the types, including a plurality of hot spots with highest optical parameter sensitivity within those hot spots of that type into the group of selected features.
27. The method of clause 26, where a number of hot spots included from each type into the group of selected features is not the same.
28. The method of any of clauses 21 to 24, further comprising:
identifying all hot spots in the region;
grouping the hot spots into a plurality of types;
within each of the types, identifying a hot spot with a highest optical parameter sensitivity within all the hot spots of that type;
selecting a subset of types whose respective hot spots with the highest optical parameter sensitivity are the highest among the plurality of types;
within each of subset of the types, including a plurality of hot spots with highest optical parameter sensitivity within those hot spots of that type into the group of selected features.
29. The method of clause 28, wherein selecting the subset of types comprises ranking the plurality of types by their respective hot spots of the highest optical parameter sensitivity.
30. The method of any of clauses 21 to 29, further comprising:

determining whether any of the hot spots in the region is defective under the target optical parameter for the region; and
if at least one of the hot spots in the region is defective, adjusting how the target optical parameter for the region is determined from the characteristic of the group of selected features and redetermining the target optical parameter for the region.
31. The method of any of clauses 21 to 30, wherein the target optical parameter is a weighted average of target optical parameters for the characteristic of the group of selected features.
32. The method of any of clauses 21 to 29, wherein determining the target optical parameter comprises optimizing a function of the characteristic of the group of selected features by adjusting a set of parameters of the function.
33. The method of clause 32, wherein adjusting the set of parameters is by minimizing or maximizing a cost function that is a function of the set of parameters and whose value is affected by the target optical parameter for the region.
34. The method of clause 30, wherein adjusting how the target optical parameter for the region is determined comprises adding an anchor feature into the group of selected features, removing an anchor feature from the group of selected features, designating an anchor feature in the group of selected features as a non-anchor feature, or designating a non-anchor feature in the group of selected features as an anchor feature.
35. The method of any of clauses 21 to 34, wherein the optical parameter comprises dose.
36. A computer program product comprising a computer readable medium having instructions recorded thereon, the instructions when executed by a computer implementing the method of any of the above clauses.

Aspects of the disclosure can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the disclosure may be implemented using suitable apparatus which may specifically take the form of a programmable computer running a computer program arranged to implement a method as described herein.

The descriptions above are intended to be illustrative, not limiting. Thus, it will be apparent to one skilled in the art that modifications may be made to the embodiments as described without departing from the scope of the claims set out below.

What is claimed is:
1. A method for improving a lithographic process for imaging a portion of a design layout onto a substrate using a lithographic apparatus, the method comprising:
obtaining a relationship of a characteristic of one or more features in the portion with respect to dose;
obtaining a value of the characteristic; and
obtaining, by a hardware computer, a target dose based on the value of the characteristic and the relationship and on a dose associated with an anchor feature.
2. The method of claim 1, wherein the characteristic is selected from a group consisting of critical dimension (CD), mask error, CD uniformity (CDU), process window, defocus, yield, probability of existence of defects, and stochastic effect.

3. The method of claim 1, wherein the characteristic is mask error and wherein obtaining the relationship comprises obtaining a sensitivity of CD with respect to the dose and a value of the mask error enhancement factor (MEEF).

4. The method of claim 1, wherein the relationship is a function of positions of the one or more features in the portion of the design layout.

5. The method of claim 1, wherein target doses at a plurality of positions are represented as a map.

6. The method of claim 1, wherein the target dose is a target dose of a region of the design layout, the region having multiple features therein.

7. The method of claim 6, wherein the target dose of the region is obtained from target doses and attributes of all or some individual features in the region, and/or wherein the target dose is obtained by calculating a weighted average of target doses of all or some individual features in the region.

8. A method comprising:
selecting a subset of one or more features from a plurality of features of a region of a patterning device pattern into a group of one or more selected features, based on a sensitivity of the feature to an optical parameter; and
determining a target optical parameter for the region from a characteristic of the group of one or more selected features in the region.

9. The method of claim 8, wherein the group of one or more selected features comprises an anchor feature, and/or wherein the group of one or more selected features comprises a hot spot in the region, and/or wherein the group of one or more selected features comprises not all hot spots in the region.

10. The method of claim 8, further comprising:
identifying hot spots in the region; and
including into the group of one or more selected features a plurality of hot spots with highest optical parameter sensitivity among the identified hot spots in the region.

11. The method of claim 8, further comprising:
determining whether any hot spot in the region is defective under the target optical parameter for the region; and
responsive to at least one of the hot spots in the region being determined as defective, adjusting how the target optical parameter for the region is determined from the characteristic of the group of one or more selected features and redetermining the target optical parameter for the region.

12. A computer program product comprising a non-transitory computer readable medium having instructions recorded thereon, the instructions configured to cause a hardware computer system to at least:
obtain a relationship of a characteristic of one or more features in a portion of a design layout with respect to dose, wherein the design layout is for being imaged onto a substrate using a lithographic apparatus as part of a lithographic process;
obtain a value of the characteristic; and
obtain a target dose based on the value of the characteristic and the relationship and on a dose associated with an anchor feature.

13. The computer program product of claim 12, wherein the characteristic is selected from a group consisting of critical dimension (CD), mask error, CD uniformity (CDU), process window, defocus, yield, probability of existence of defects, and stochastic effect.

14. The computer program product of claim 12, wherein the characteristic is mask error and wherein obtaining the relationship comprises obtaining a sensitivity of CD with respect to the dose and a value of the mask error enhancement factor (MEEF).

15. The computer program product of claim 12, wherein the relationship is a function of positions of the one or more features in the portion of the design layout.

16. A computer program product comprising a non-transitory computer readable medium having instructions recorded thereon, the instructions configured to cause a hardware computer system to at least:
selecting a subset of one or more features from a plurality of features of a region of a patterning device pattern into a group of one or more selected features, based on a sensitivity of the feature to an optical parameter; and
determining a target optical parameter for the region from a characteristic of the group of selected features in the region.

17. The computer program product of claim 16, wherein the group of one or more selected features comprises an anchor feature, and/or wherein the group of one or more selected features comprises a hot spot in the region, and/or wherein the group of one or more selected features comprises not all hot spots in the region.

18. The computer program product of claim 16, wherein the instructions are configured to cause the hardware computer system to:
identify hot spots in the region; and
include into the group of one or more selected features a plurality of hot spots with highest optical parameter sensitivity among the identified hot spots in the region.

19. The computer program product of claim 16, wherein the instructions are configured to cause the hardware computer system to:
determine whether any hot spot in the region is defective under the target optical parameter for the region; and
responsive to at least one of the hot spots in the region being determined as defective, adjust how the target optical parameter for the region is determined from the characteristic of the group of one or more selected features and redetermining the target optical parameter for the region.

20. The computer program product of claim 16, wherein the instructions are further configured to cause the hardware computer system to determine the target optical parameter based on an optical parameter value associated with an anchor feature.

* * * * *